United States Patent
Birnstock et al.

(10) Patent No.: US 8,212,245 B2
(45) Date of Patent: Jul. 3, 2012

(54) LIGHT EMITTING ORGANIC COMPONENT AND METHOD FOR PRODUCTION THEREOF

(75) Inventors: Jan Birnstock, Dresden (DE); Ansgar Werner, Dresden (DE); Carsten Rothe, Dresden (DE)

(73) Assignee: Novaled AG, Dresden (DE)

( * ) Notice: Subject to any disclaimer, the term of this patent is extended or adjusted under 35 U.S.C. 154(b) by 0 days.

(21) Appl. No.: 12/991,572

(22) PCT Filed: May 5, 2009

(86) PCT No.: PCT/DE2009/000600
§ 371 (c)(1),
(2), (4) Date: Jan. 21, 2011

(87) PCT Pub. No.: WO2009/135466
PCT Pub. Date: Nov. 12, 2009

(65) Prior Publication Data
US 2011/0114932 A1    May 19, 2011

(30) Foreign Application Priority Data

May 9, 2008 (DE) .................. 10 2008 023 035

(51) Int. Cl.
*H01L 51/52* (2006.01)
*H01L 51/56* (2006.01)

(52) U.S. Cl. ............... 257/40; 257/E51.018; 257/101; 438/37; 438/99

(58) Field of Classification Search ............ 438/37, 438/99, FOR. 333, FOR. 135; 257/E51.018, 257/40, 101
See application file for complete search history.

(56) References Cited

U.S. PATENT DOCUMENTS

| 7,151,339 B2 * | 12/2006 | Adamovich et al. | 313/504 |
| 7,582,508 B2 * | 9/2009 | Park | 438/99 |
| 7,839,080 B2 * | 11/2010 | Kim et al. | 313/504 |
| 7,868,536 B2 * | 1/2011 | Aurongzeb | 313/503 |
| 2004/0164674 A1 | 8/2004 | Ottermann et al. | |
| 2005/0017247 A1 * | 1/2005 | Koo et al. | 257/72 |
| 2006/0033428 A1 * | 2/2006 | Yu et al. | 313/506 |
| 2006/0177696 A1 * | 8/2006 | Park | 428/690 |

(Continued)

FOREIGN PATENT DOCUMENTS

EP  1453117  9/2004

(Continued)

OTHER PUBLICATIONS

International Preliminary Report on Patentability for PCT/DE2009000600, English Translation, Dec. 18, 2010.

*Primary Examiner* — George Fourson, III
(74) *Attorney, Agent, or Firm* — Sutherland Asbill & Brennan, LLP

(57) ABSTRACT

The invention relates to a light-emitting organic component, in particular a light-emitting organic diode, having an electrode spreading over an electrode surface area and a counter electrode spreading over a counter electrode surface area as well as an organic layer array formed between the electrode and the counter electrode and in electrical contact therewith, an electrical resistance gradient in a direction substantially parallel to the electrode surface area being formed within a region of the organic layer array at least partially overlapping with the electrode surface area. Furthermore, the invention relates to a method for the production of a light-emitting organic component.

22 Claims, 7 Drawing Sheets

U.S. PATENT DOCUMENTS

| | | | |
|---|---|---|---|
| 2006/0188746 A1* | 8/2006 | Iou | 428/690 |
| 2007/0278501 A1* | 12/2007 | Macpherson et al. | 257/86 |
| 2008/0197371 A1 | 8/2008 | Ottermann et al. | |
| 2008/0299384 A1* | 12/2008 | Kim et al. | 428/336 |
| 2009/0058272 A1* | 3/2009 | Kim et al. | 313/504 |
| 2011/0114932 A1* | 5/2011 | Birnstock et al. | 257/40 |
| 2011/0169400 A1* | 7/2011 | Seo et al. | 313/504 |
| 2011/0180792 A1* | 7/2011 | Lee et al. | 257/40 |
| 2011/0312165 A1* | 12/2011 | Shimomura et al. | 438/487 |

FOREIGN PATENT DOCUMENTS

| | | |
|---|---|---|
| WO | 2006077136 | 7/2006 |
| WO | 2008/034405 | 3/2008 |

* cited by examiner

LIGHT EMITTING ORGANIC COMPONENT AND METHOD FOR PRODUCTION THEREOF

CROSS-REFERENCE TO RELATED APPLICATION

This is a submission pursuant to 35 U.S.C. 154(d)(4) to enter the national stage under 35 U.S.C. 371 for PCT/DE2009/000600, filed May 5, 2009. Priority is claimed under 35 U.S.C. 119(a) and 35 U.S.C. 365(b) to German Patent Application Number 10 2008 023035.9, filed May 9, 2008. The subject matters of PCT/DE2009/000600 and German Patent Application Number 10 2008 023035.9 are expressly incorporated herein by reference in their entirety.

The invention relates to technologies in the field of light-emitting organic components, in particular light-emitting organic diodes (OLEDs).

BACKGROUND OF THE INVENTION

In recent years, light-emitting organic components, in particular in the form of organic light-emitting diodes (OLEDs) have become more and more important. Besides applications in the field of displays, applications for lighting purposes also have increasingly moved to the centre of development work. The big potential of the technology in this field has been recognized generically and it is assumed that OLEDs are going to become one of the most important technologies in the field of lamps and lighting in future. Meanwhile, both the performance efficiencies and the life of components have reached a competitive level in comparison to alternative lighting technologies, such as incandescent lamps, fluorescent lamps or inorganic LEDs.

The light-emitting organic components are planar components in which a homogeneous radiation of light becomes more difficult with an increasing size of the surface area. This is in particular associated with the transparent electrode through which the radiation of light takes place and which in most cases consists of a conductive oxide, such as indium tin oxide (ITO). The surface resistivity of this electrode is typically about 20 ohm/square. At a light intensity of 1000 $cd/m^2$ and a current efficiency of 50 cd/A, a light-emitting organic component, such as an OLED, having a square base area of 5 cm×5 cm during operation requires a current flow of about 0.05 A. If the electrodes of the component are now only contacted from one side, this results in a voltage drop of about 0.5 V. For customary light-emitting organic diodes, this voltage difference between the region of the connection to the electrode and sections of the electrode away from the connection already corresponds to a difference in light intensity which can be perceived with the naked eye.

For a light-emitting organic diode in a PIN implementation which is characterized by a particularly steep I-V curve, such a voltage difference can already account for a factor of more than 100 in the light intensity of the component. FIG. 1 shows a typical luminance-voltage curve. A light intensity of 1000 $cd/m^2$ is achieved at 2.4 V. This shall be the mean voltage of the large-area component. This means that on one side of the lighting area, a voltage of about 2.15 V is applied whereas the voltage is 2.65 V on the other side. This corresponds to light intensities of 20 $cd/m^2$ and 3500 $cd/m^2$. Such differences in light intensity are not only undesired for the practical use of the light-emitting organic components but especially for lighting applications not acceptable.

To improve the lighting appearance of light-emitting organic components in the surface area, it was provided for using so-called IMI stacks (ITO-metal-ITO) instead of the material ITO in which silver is also employed besides ITO, the electrical conductivity being improved by this by a factor of about 5. However, the problem is only partially solved through this.

Alternatively, it was suggested to arrange an additional metal grid on or under the transparent electrode which reduces the surface resistivity of the transparent electrode dramatically. However, the production of such a metal grid is technically elaborate and requires more additional lithography steps within the production process. Furthermore, the metal grid reduces the active area of the light-emitting component.

Furthermore, it was suggested to form larger lighting areas by means of several small light-emitting organic components, for example OLEDs. This approach is also associated with additional costs for structuring and/or masking steps. Furthermore, spaces between the individual components remain visible and form a visual flaw.

SUMMARY OF THE INVENTION

It is an object of the invention to create an improved light-emitting organic component as well as a method for the production thereof which allow for an optimized lighting appearance.

This object is achieved according to the invention by a light-emitting organic component according to the independent claim 1 as well as a method for the production thereof according to the independent claim 12. Advantageous implementations of the invention are the subject matter of dependent claims.

BRIEF DESCRIPTION OF FIGURES

In the following, the invention is explained in more detail using exemplary embodiments with reference to figures of a drawing. They show.

DETAILED DESCRIPTION OF EMBODIMENTS

Figure 1:
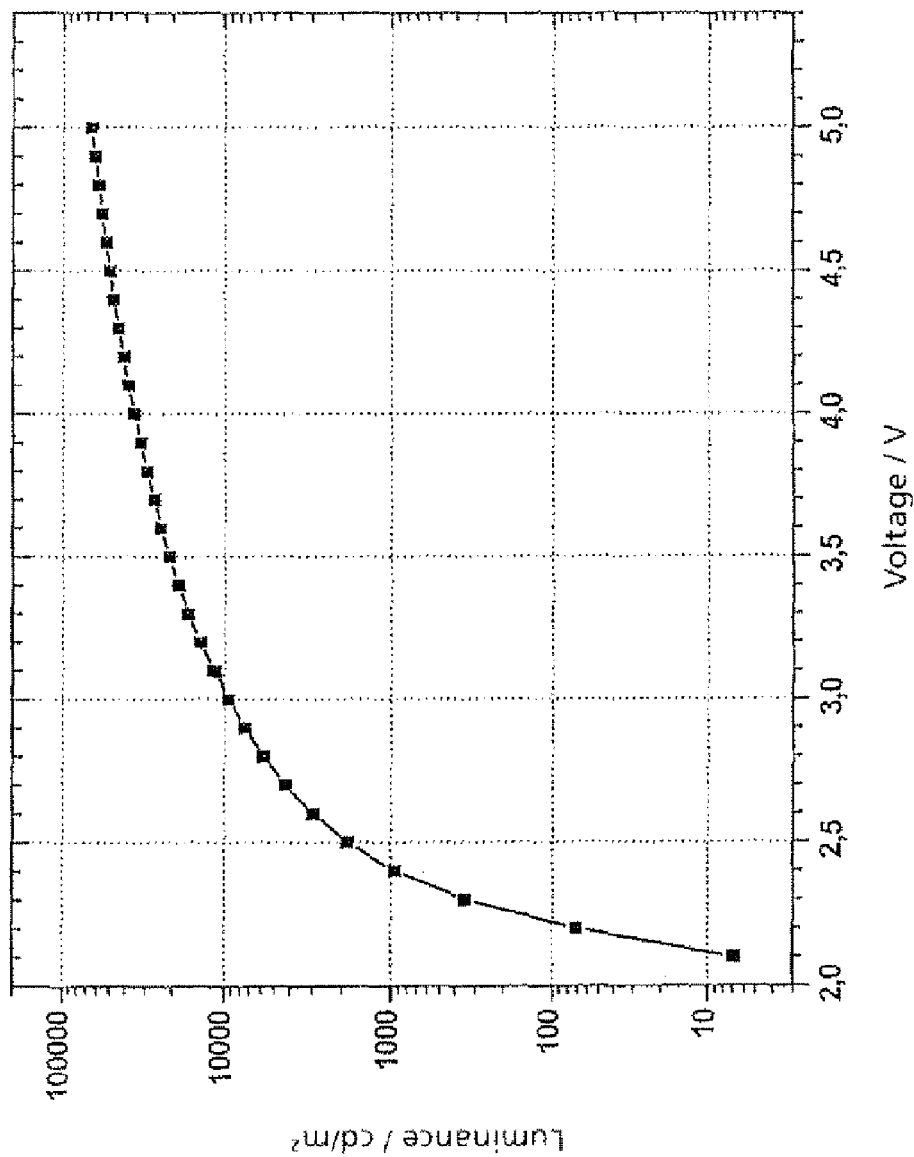
FIG. 1 a luminance-voltage curve of a light-emitting organic diode according to the prior art, FIG. 2 a schematic illustration of a layer construction of a light-emitting organic component with a layer thickness gradient, FIG. 3 a schematic illustration of a shadow mask which can be used for the formation of a layer thickness gradient, FIG. 4 a schematic illustration of a layer array of a light-emitting organic component in which a compensation for a layer thickness gradient is provided, FIG. 5 a graphic illustration for the operating voltage as a function of the thickness of an organic layer, FIG. 6 a schematic illustration of a layer array of an organic light-emitting component to explain a method for the formation of an electrical doping gradient, and FIG. 7 graphic illustrations for characteristics of a component produced according to an exemplary embodiment 2.

In the following description, the same reference numbers are used in the figures for identical features.

The invention encompasses the idea of a light-emitting organic component, in particular a light-emitting organic diode, having an electrode spreading over an electrode surface area and a counter electrode spreading over a counter electrode surface area as well as an organic layer array formed between the electrode and the counter electrode and in electrical contact therewith, an electrical resistance gradient in a direction substantially parallel to the electrode surface area being formed within a region of the organic layer array at least partially overlapping with the electrode surface area.

By means of the electrical resistance gradient, the compensation of differences in electrical feed resistance in the electrode surface area is made possible which usually have a continuous course. The electrical resistance gradient compensates the position-dependent electrical feed resistances of the electrodes at least partially. In this way, the electrical resistance of the light-emitting component is kept equal over the area of the component as far as possible which leads to a constant current flow such that an areally homogeneous lighting appearance of the component results. The formation of the electrical resistance gradient over one or more layers of the organic layer array changes the electrical resistance over the organic layer array accordingly. The change in resistance may have a linear or non-linear course. Any two-dimensional or three-dimensional gradient profiles can be produced which optionally also comprise continuous or discontinuous resistance courses, a gradient course being opposed to the course of the electrical feed resistances and insofar targetedly completely or partially compensating its change over the component area being formed.

The term resistance gradient in the sense understood herein means an electrical resistance decreasing along a macroscopic section in a direction leading away from the starting point, as opposed to local changes in resistance possibly occurring on a microscopic scale within the organic layer array.

The light-emitting organic component may also be implemented as a so-called bottom-emitting or top-emitting component. A transparent implementation of the component is also possible. The light-emitting organic component in the suggested implementation is suitable for the most diverse application purposes, for example in displays. The areally homogeneous lighting appearance of the component is particularly advantageous for lighting devices with one or more such components.

A preferred further development of the invention provides for the resistance gradient being formed adjacent to a connection formed at the electrode with a maximal electrical resistance. In one implementation, the electrical resistance continuously decreases along the resistance gradient in the organic layer array away from the connection. The electrical resistance within the region of the resistance gradient has its highest values in regions in which the electrical feed resistance in the electrode surface area is the lowest, for example in the vicinity of the connection of the electrode.

In a practical implementation of the invention, it can be provided for the resistance gradient being formed with several partial resistance gradients. The partial resistance gradients may be formed spatially separated from each other or also overlapping in parts. In a practical implementation, the partial resistance gradients collectively start from a region of origin which is located within the region of the connection of the electrode, for example. It can also be provided for several connections at the electrode. In this case, changes in the electrical feed resistance in the electrode surface area resulting in conjunction with the several connections can at least partially be compensated with the several partial resistance gradients.

An advantageous embodiment of the invention provides for the electrical resistance gradient being formed at least in sections by means of an electrical doping gradient in the organic layer array. A gradient profile formed in this way is formed by means of a doping profile within one or more electrically doped layers in the organic layer array. Electrical dopings are found in doped charge-carrier transport layers, for example. Depending on the preferred charge transport, an n-doping or a p-doping can be formed. At least within the region of the electrical doping gradient, the layers of the organic layer array are preferably formed with a consistent layer thickness. A possibility to form the electrical doping gradient is the partial subsequent deactivation of an electrical doping which itself was formed by depositing the layers of the organic layer array wherein a matrix material and an electrical doping material were collectively deposited for the doped layers. To form such doped layers, the types of production methods known as such to the person skilled in the art can be used. As an alternative to this, an electrical doping can be activated in a targeted manner to form the gradient profile. The formation of the doping gradient is explained in more detail below.

A further development of the invention preferably provides for the electrical resistance gradient being formed at least in sections by means of a layer thickness gradient in the organic layer array. In this implementation, a desired gradient profile is formed at least in sections by means of a thickness profile changing over the surface area. The thickness of one or more layers in the organic layer array is set to be non-uniform, this resulting in corresponding changes in the electrical resistance within these regions.

In an advantageous implementation of the invention, it can be provided for the layer thickness gradient being formed by means of a wedge-shaped layer in the organic layer array. The wedge-shaped layer has its maximum thickness in regions in which the electrical feed resistance in the electrode surface area is the lowest, for example in the vicinity of the connection of the electrode.

A further development of the invention can provide for a further wedge-shaped layer being formed in the layer array which has a wedge shape opposed to the wedge-shaped layer and a lower electrical layer resistance than the wedge-shaped layer. Preferably, the further wedge-shaped layer is formed as an electrically doped layer such that the electrical resistance of this layer can be disregarded. In this array, the layer thickness is constant over the entire light-emitting component, leading to an advantageous light output due to being homogeneous.

A preferred further development of the invention provides for the layer thickness gradient extending over several layers in the organic layer array. In this connection, several layers in the organic layer array may have the same layer thickness tendency, i.e. a decreasing layer thickness in the same direction, for example.

In a practical implementation of the invention, it can be provided for the layer thickness gradient being formed with inclusion of at least one layer selected from the following layers of the organic layer array: blocking layer, intermediary layer, emission layer and charge-carrier transport layer. A blocking layer commonly serves in the organic layer array to prevent the migration of a type of electrical charge carriers, i.e. electrons or holes, as efficiently as possible. In the emission layer, the recombination of electrons and holes with emission of light takes place. A charge-carrier transport layer may be implemented as an electron transport layer or hole transport layer such that either electrons or holes are preferably transported in this layer. The formation of the layer thickness gradient is preferably performed in the blocking layer or an intermediary layer. The doping gradient is preferably formed in one or more charge-carrier transport layers.

An advantageous embodiment of the invention provides for the layer thickness gradient being formed with inclusion of a current-limiting layer in the organic layer array. A current-limiting layer is a layer to limit the current flow in the light-emitting component. The layer thickness gradient to form the electrical resistance gradient can be formed completely or partially by means of the current-limiting layer.

Preferably, a further development of the invention provides for the electrode being a transparent electrode. The transparent design of the electrode means that a radiation of the light generated within the emission region of the component can be effected through it. Components radiating light on one side have a transparent electrode. In transparent components, both electrode and counter electrode are implemented transparently.

In connection with the advantageous implementations of the method for the production of a light-emitting organic component, the explanations made in connection with related embodiments of the light-emitting organic component apply accordingly. To produce the light-emitting organic component, the methods known as such to the person skilled in the art can be employed, for example vacuum evaporation. To form layers having a non-constant thickness, the shadow mask technology may be employed in which regions are covered when applying the layer materials whereas the deposition of layers is continued in other regions such that different layer thickness regions form.

In one embodiment, the layer thickness gradient is produced by using a comb-like shadow mask. The use of a rotating, eccentrically shaped shadow mask can also be provided for. Furthermore, a moving shadow mask can be used to form the layer thickness gradient which is pulled during the processing of the layer thickness gradient. Alternatively or additionally, a linear evaporator source with a gradual deposition rate can be employed to produce the layer thickness gradient. In so-called in-line evaporator units, it can also be provided for a belt or substrate speed being changed in relation to the linear evaporator source and thus a layer thickness gradient being generated.

In the following, a method for forming a doping gradient by means of spatial dosage of the light density is explained, the method comprising the following steps: (i) producing a light-emitting organic component comprising an electron-conductive layer made of matrix material and n-dopant precursors or n-dopants substantially homogeneously embedded therein and/or a hole-conductive layer made of matrix material and p-dopant precursors or p-dopants substantially homogeneously embedded therein; (iia) activating by irradiating the dopant precursors and/or dopants within the entire component by means of light of a suitable wavelength and dosage and irradiating or thermally exciting at least one or more sub-regions of the component with a light dose stepped over the surface area of the light-emitting component or a thermal output far the partial (gradual) deactivation of the dopants within the irradiated region or (iib) irradiating or thermally exciting at least one or more sub-regions of the component with a light dose stepped over the surface area of the light-emitting component or a thermal output for the partial (gradual) activation of the dopant precursors within the irradiated region.

Thus, it is essential for (ii) that not the entire component is irradiated with a homogeneous light dose. In particular, a lower light dose is preferably chosen for (iia) in regions in which a low resistance is desired and accordingly a higher dose for regions with a high desired resistance. On the other hand, a high light dose is preferably chosen for (iib) in regions in which a low resistance is desired and accordingly a low dose for regions with a high desired resistance. For the irradiation of the dopant precursors and/or dopants, a large number of different light sources can be used. To activate the dopant precursors, visible light of the UV/Vis region of about 200 to 800 nm, preferably of about 300 to 520 nm, particularly preferably of about 350 to 450 nm, is suited. To deactivate the dopants, light of the near UV region is suited, preferably having a wavelength of less than 380 nm, preferably less than 340 nm.

It is preferred that the stepped light dose during the irradiation in steps (iia) and (iib) is performed by spatially and temporally covering the sub-regions not to be irradiated or to be irradiated slightly, preferably by arranging one or more shadow masks or a neutral grey filter on the component. For example, a combined spatial and temporal coverage can be achieved by means of a rotating eccentric shadow mask. The spatially stepped light dose required for the irradiation in steps (iia) and (iib) is preferably generated by means of a neutral grey filter. It was also suggested to perform the irradiation in steps (iia) and (iib) with electromagnetic radiation, in particular visible light, UV light or IR light, for example laser light. Furthermore, other focussed light sources suitable for lithography applications can be used. It is particularly preferred that the activation and deactivation in steps (iia) and (iib) is irreversible.

One embodiment is characterized by a heterocyclic radical or diradical, its dimers, oligomers, polymers, dispiro compounds and polycycles or leucobases of dyes are used as the dopant precursor or dopant. In this connection, it is preferably provided for the structures of the dopant precursor or dopants being selected from the following formule:

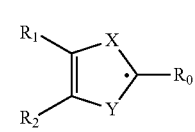

1

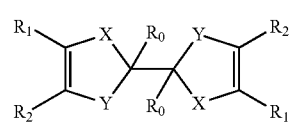

2

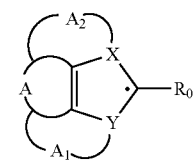

3

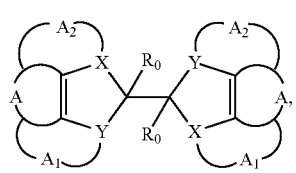

4 wherein the structures 3 and 4 have one or more cyclic linkages A and/or $A_1$ and/or $A_2$ wherein A, $A_1$ and $A_2$ can be carbocyclic, heterocyclic and/or polycyclic ring systems which can be substituted or unsubstituted;

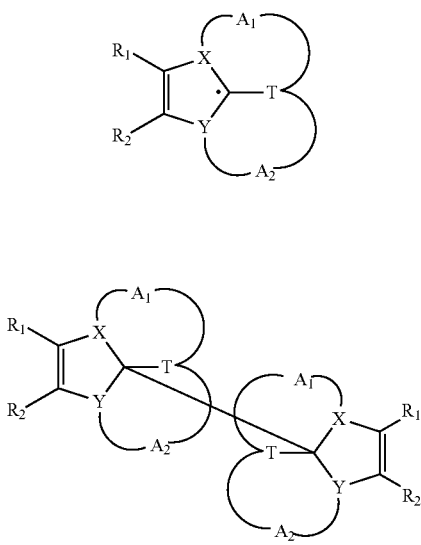

5

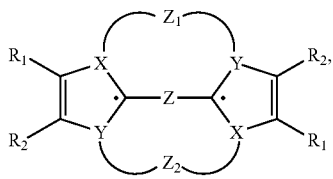

6 wherein $A_1$ and $A_2$ can be present individually or together and $A_1$ and $A_2$ are as defined for structures 3 and 4 and $T=CR_{22}$, $CR_{22}R_{23}$, N, $NR_{21}$, O or S;

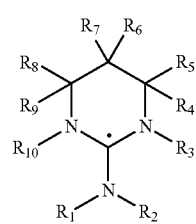

7 wherein structure 7 has one or more bridge links Z and/or $Z_1$ and/or $Z_2$ and Z, $Z_1$ and $Z_2$ can be independently selected from alkyl, alkenyl, alkinyl, cycloalkyl, sililyl; alkylsililyl, diazo, disulphide, heterocycloalkyl, heterocyclyl, piperazinyl, dialkyl ether, polyether, primary alkylamine, arylamine and polyamine, aryl and heteroaryl;

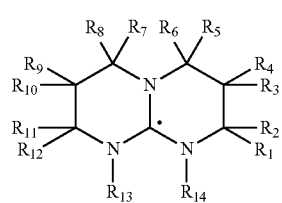

8a

8b

8c wherein the ring size in structures 8a-8c can vary from 5-7 atoms, depending on the heterocycle;

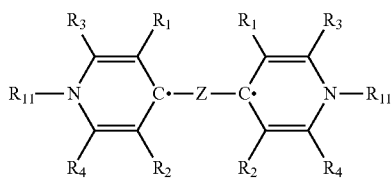

9

10

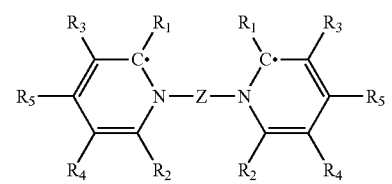

11 wherein X, Y=O, S, N, $NR_{21}$, P or $PR_{21}$; Z is defined as above; $R_{0-19}$, $R_{21}$, $R_{22}$ and $R_{23}$ are independently selected from, substituted or unsubstituted, aryl, heteroaryl, heterocyclyl, diarylamine, diheteroarylamine, dialkylamine, heteroarylalkylamine, arylalkylamine, H, F, cycloalkyl, halocycloalkyl, heterocycloalkyl, alkyl, alkenyl, alkinyl, trialkylsilyl, triarylsilyl, halo, styryl, alkoxy, aryloxy, thioalkoxy, thioaryloxy, silyl and trialkylsilylalkinyl, or $R_{0-19}$, $R_{21}$, $R_{22}$ and $R_{23}$, alone or in combination, are part of a ring system, (hetero)aliphatic or (hetero)aromatic.

It is particularly advantageous that A, $A_1$ and $A_2$ are selected from substituted and unsubstituted, aromatic and heteroaromatic ring systems, preferably benzo, naphtha, thiophene, furan, thiazole, imidazole, oxazole, thiadiazole, pyrazine, thiopyran, dithiine, phthalic acid imide and dithiazole radicals wherein one or more substituents can be present which can be selected from $R_{0-19}$, $R_{21}$, $R_{22}$ and $R_{23}$. It can also be provided for Z, $Z_1$ and $Z_2$ being selected from piperazinyl and alkyl or cycloalkyl.

It is also beneficial that the dopant precursor or the dopant are selected from the following structures:
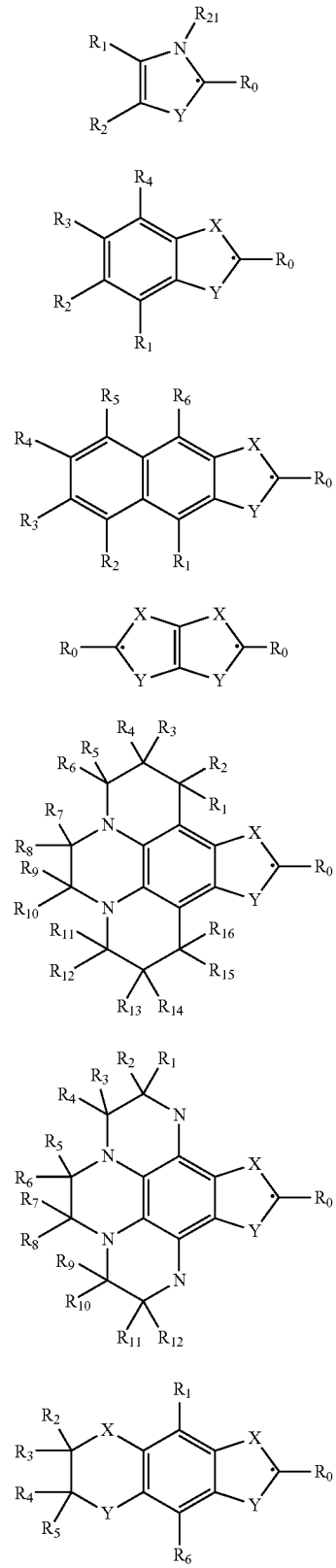
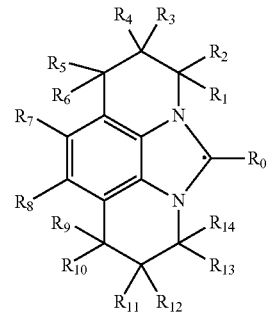
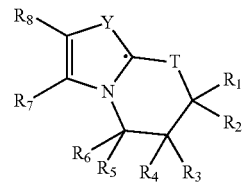
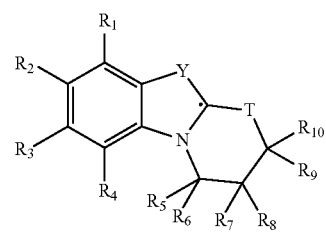
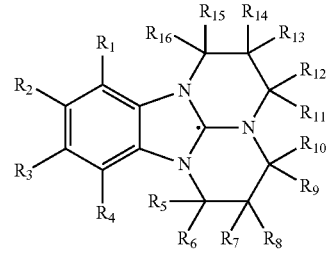
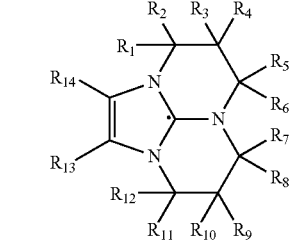
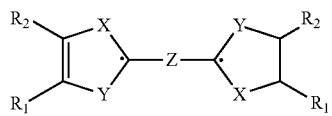
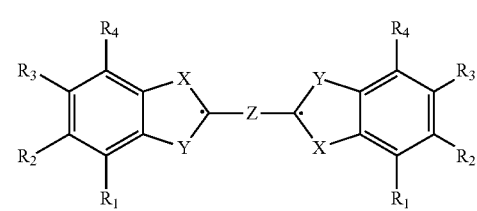

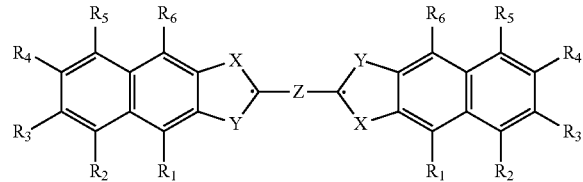

7c

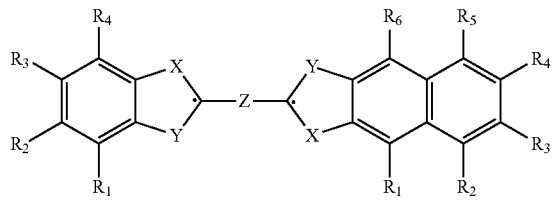

7d

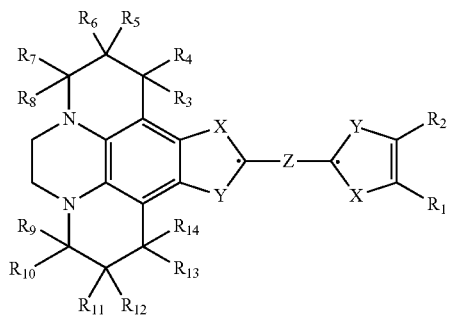

7e

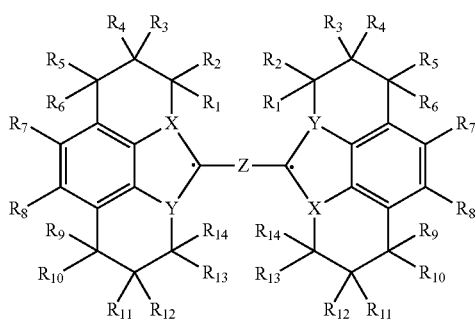

7f

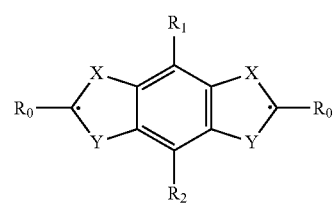

7g

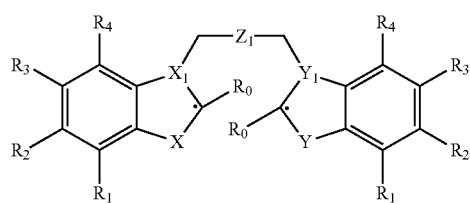

7h

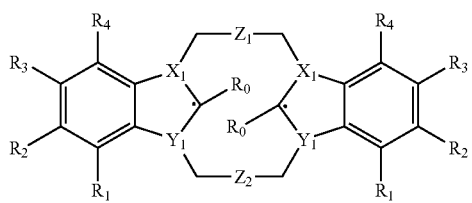

7i wherein $X_1, Y_1$=N or P.

Furthermore, it is practical that $R_{0-19}$, $R_{21}$, $R_{22}$ and $R_{23}$ are selected from, substituted or unsubstituted, phenyl, biphenyl, naphthyl, anthranyl, thienyl, imidazolyl, pyrrolyl, thiazolyl, oxazolyl, thiadiazolyl, piperidyl, pyrrolidyl, morpholyl and thiomorpholyl. It is also proposed that $R_{0-19}$, $R_{21}$, $R_{22}$ and $R_{23}$ are selected from alkyl, cycloalkyl, dialkylamine, diarylamine, alkoxy, aryloxy, thioaryl, thioalkoxy, perfluoroalkyl. It is preferred that the polycycle is a tricycle. Furthermore, photoinitiators can preferably be added to the electron-conductive layer, preferably ketones, such as phenones.

According to the invention, the light-emitting organic component having a spatially homogeneous light density which can be obtained by the method according to the invention is preferably an organic light-emitting diode. Finally, the light-emitting organic component can in particular be used as a lighting means but also as a logo, information sign, decorative application, name badge, barcode, placard, billboard or even a lighting track for display windows.

It was surprisingly found that organic components which, due to the materials used for this, may also be referred to as organic semiconductor devices, having a spatially homogeneous light density can be produced in a simple and efficient manner by targetedly irradiating these components after their actual production to allow for an areally homogeneous light density. In this connection, the sub-regions of the semiconductor device to be homogenised are irradiated with different light doses, dose being understood to mean the radiation performance, the product of radiation intensity and time. According to the invention, two irradiation variants exist. On the one hand, the electron-conductive layer of the organic semiconductor device can be made of matrix material and dopant precursors substantially homogeneously embedded therein. With different dosages of the irradiation of selected sub-regions of this semiconductor device, the dopant precursors are partially or completely activated by irradiation according to the dosage of the irradiation and can henceforth act as usual dopants in the electron-conductive layer. Obviously, a low light dose is accompanied by an incomplete activation of the dopant which leads to an electrical resistance which is higher in these sub-regions. On the other hand, already finished dopants may be used in the electron-conductive layer of the semiconductor device. The latter can be achieved, for example, by complete irradiation with suitable light, typically from the visible wavelength region. Through the dosed irradiation of selected regions with light of a suitable wavelength, typically from the UV region, the dopants located in these regions are partially or completely deactivated such that the electrical resistance in these sub-regions increases. In both cases, the resistance of the doped layer is determined by the concentration of the active dopants. The spatial distribution of this concentration can be targetedly set by activating or deactivating dopants by means of irradiation, the achieved electrical resistance when activating behaving proportional to the light dose and correspondingly inversely proportional when deactivating. In both cases, a high electrical resistance is preferably generated in regions with a low electrical feed resistance. As a result, the homogeneity of the light density over the surface area of the light-emitting diode is improved.

By means of the method, the homogeneity of the light density of organic light-emitting components can be markedly improved with small expenditure. The subsequent (photochemical) reaction as it takes place in the described method influences the basic characteristics in defined regions of an organic semiconductor device, such as an OLED: the increase or decrease of the conductivity of an organic semiconducting layer generates domains of increased or reduced light intensity at a constant operating voltage of an OLED. To achieve this, chemical compounds are employed, the doping capabilities and activation threshold of which are sufficient for technical applications.

The great attractiveness of this lithography method is that these components thus homogenised are still highly efficient which would not be the case when simply applying an absorption-based neutral grey filter, for example. The easiest way to illustrate this is with an equivalent circuit: in principle, the areally homogeneous OLED component corresponds to a parallel connection of diode regions with a high feed resistance and diode regions with a low feed resistance. The diode regions with the highest feed resistance are illuminated to the least extent and thus define the maximum light density of the original component. The described spatial profile of the active dopants in the doped layer compensates the different feed resistances in the different regions of the OLED. Accordingly, the same current density flows through the different diode regions everywhere in the compensated OLED. This current density is preferably identical with the current density of the diode regions with the highest feed resistance. The current density in the previously too bright regions is reduced proportionally which is accompanied by an unchanged efficiency of the diode. The result is a high performance efficiency of the homogenised component.

Preferred dopant precursors or dopants were already mentioned above. The preferred doping mechanism is to cleave a suitable compound photolytically into two energy-rich radicals, for example, which transfer their electron to the surrounding matrix due to their extremely negative redox potential. In general, a mixture of the reaction products forming after the irradiation, the very stable cations and the radical anions of the matrix as well as the non-irradiated dopant precursors is contained in the electrically doped layers. The ratio of active and inactive dopants may be set via the irradiation dose in all the regions of the OLED. The electron transfer accompanying the activation of the dopants is irreversible under the conditions in an OLED. Alternatively, a suitable compound can initially release an electron into the surrounding matrix. The radical cation thus formed subsequently decomposes into a very stable final stage and into another radical which likewise acts as a dopant. In both cases, a free diffusion of the dopants is not observed. According to this, a once impressed dopant profile is stable during the operation of the component.

As explained above, an irradiation can also take place in such a way that regions doped with dopants are targetedly partially deactivated. To this effect, according to the invention, a semiconductor device is irradiated, for example, with UV light, for example a mercury vapour lamp, for a period of time of a few seconds to a few minutes; however, an irradiation of several hours is also possible. As a result of this irradiation, it is observed that the current-voltage characteristic here becomes markedly flatter in proportion to the irradiation duration, the dose; thus the resistance of the light-emitting diode has increased in the forward direction.

Proportional to the reduced emitted light density of the OLED, the current flow is also reduced proportionally, i.e. the current efficiency remains the same before and after the irradiation. The mechanism which this effect is based upon is presumably a photoinduced reaction of the p-dopant with the anode material, a transparent conductive oxide, e.g. indium tin oxide. As only the interface between p-doped transport layer and ITO anode is responsible for the described effect, the method according to the invention works for all electronic components which have such an interface between a p-doped hole transport layer and an electrode made of a conductive oxide. For all components of this kind, the injection of holes from the anode into the p-transport layer can be set via the irradiation. In particular, the method also works for so-called PII-OLEDs which have no n-doped electron transport layer.

Besides the described dopant precursors and dopants, leucobases of different dyes, such as of crystal violet, can be employed. In principle, however, any compound can be employed which permanently generates fragments having a particularly negative oxidation potential when irradiated with short-wave light or also when thermally excited.

As n-dopable matrix materials, quinolinato complexes, for example of aluminium or other metals of the main group, can be employed, inter alia, it also being possible that the quinolinato ligand is substituted. In particular, the matrix material may be tris(8-hydroxyquinolinato)aluminium. Other aluminium complexes with O- and/or N-donor atoms can optionally also be used. Commonly used matrix materials are also zinc phthalocyanine (ZnPc) or zinc tetraphenylporphyrine (ZnTPP) to name just a few representatives of the phthalocyanine or porphyrine complexes.

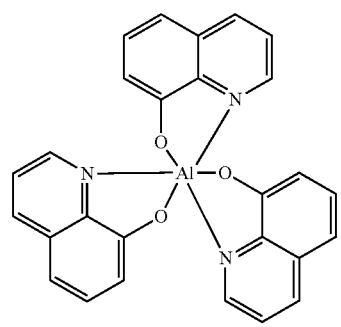

Tris(8-hydroxyquinolinato)aluminum

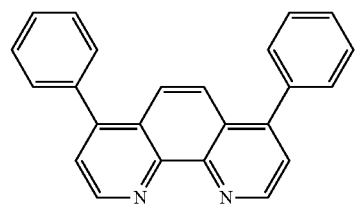

BPhen = bathophenanthroline (4,7-diphenyl-1,10-phenanthroline) $C_{24}H_{16}N_2C_{24}H_{16}N_2$

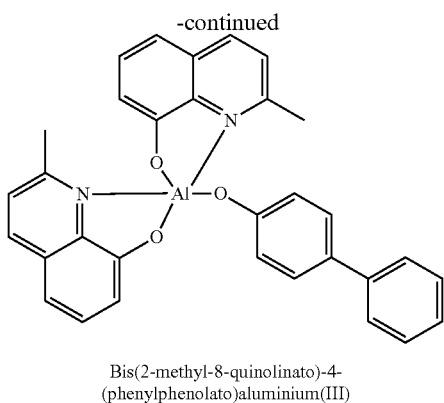

Bis(2-methyl-8-quinolinato)-4-
(phenylphenolato)aluminium(III)

The quinolinato complexes can, for example, include one, two or three quinolinato complexes while the other ligands preferably form a complex with O- and/or N-donor atoms, such as for example the Al complex mentioned above. Phenanthrolines which can be substituted or unsubstituted, in particular aryl-substituted, for example phenyl-substituted or naphthyl-substituted, may also be employed as the matrix material. In particular, bathophenanthroline (BPhen) can be used as the matrix material.

Heteroaromatics, such as in particular triazoles, can also be used as the matrix materials, optionally also pyrroles, imidazoles, triazoles, pyridines, pyrimidines, pyridazines, quinoxalines, pyrazinoquinoxalines and the like. The heteroaromatics are preferably substituted, in particular aryl-substituted, for example phenyl-substituted or naphthyl-substituted. In particular, the triazole below can be used as the matrix material.

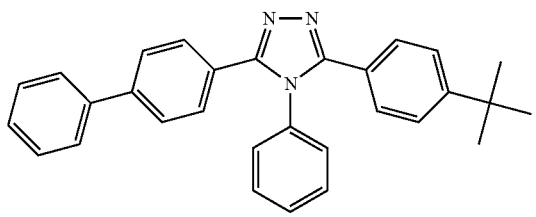

3-(4-Biphenylyl)-4-phenyl-5-tert-butylphenyl-1,2,4-triazole
$C_{30}H_{27}N_3$

Preferably, the matrix material used consists completely of metallophthalocyanine complex, in particular ZnPc, a porphyrine complex or a buckminsterfullerene, in particular fullerene C60.

It shall be understood that the mentioned matrix materials can also be employed among each other or mixed with other materials within the scope of the invention. It shall be understood that suitable other organic matrix materials which have semiconducting properties may also be used.

According to the invention, matrix materials which display a reduction potential of less than −1 V vs. Fc/Fc$^+$, preferably less than −1.7 V vs. Fc/Fc$^+$, in particular less than −2.3 V vs. Fc/Fc$^+$ are particularly preferably employed. The indication Fc/Fc$^+$ relates to the redox couple ferrocene/ferrocenium which is used as a reference in the determination of an electrochemical potential, for example cyclic voltammetry.

Figure 2:
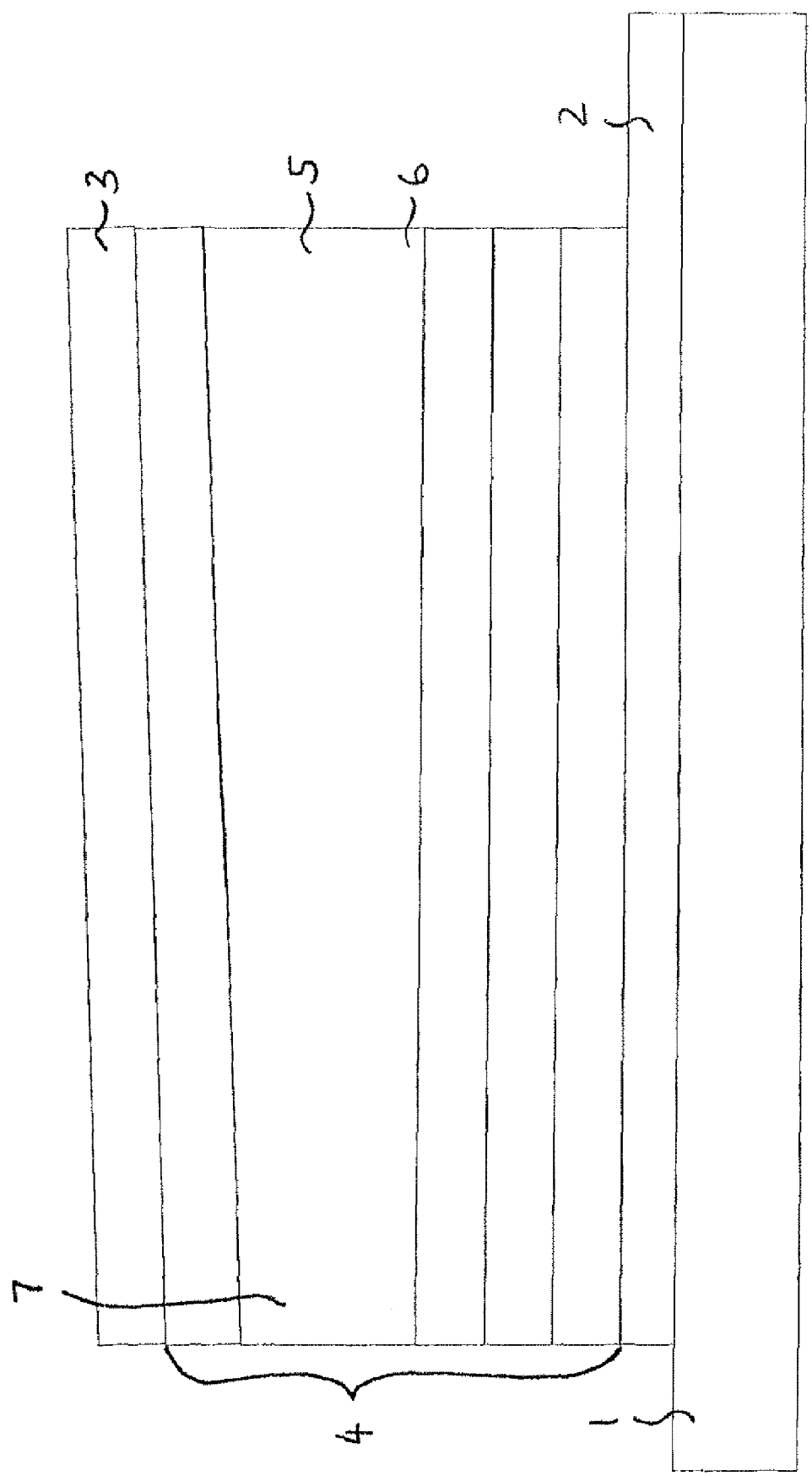

FIG. 2 shows a schematic illustration of a layer construction of an organic light-emitting component in which a base electrode 2, a cover electrode 3 and an organic layer array 4 formed between these are provided on a substrate 1. A layer thickness gradient 5 is formed in the organic layer array 4 which leads to a layer with a wedge-shaped cross-section in the depicted exemplary embodiment.

Figure 3:
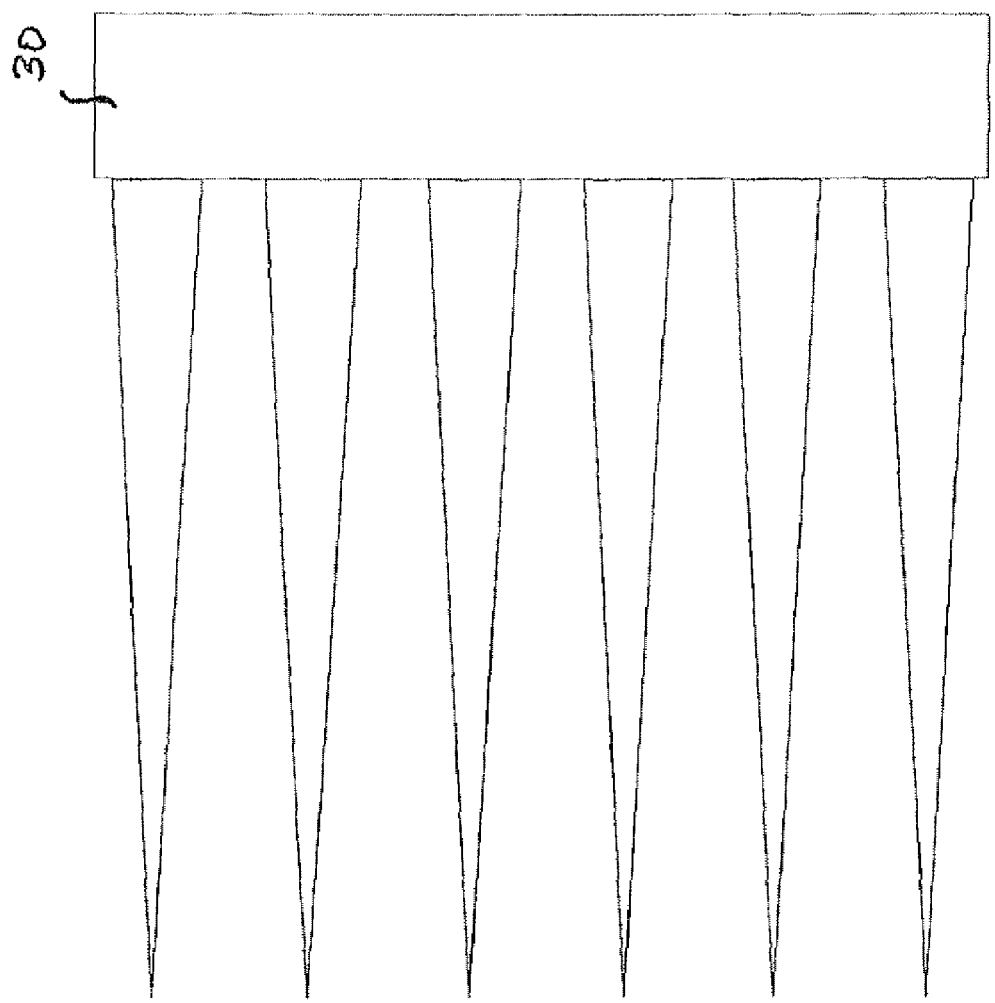

The layer with the layer thickness gradient 5 is a layer made of non-redox-doped material. It is implemented with the maximum thickness on one side 6 at which a connection (not shown) for the base electrode 2 implemented transparently is formed. The thickness is minimal on the opposite side 7. The layer thickness gradient 5 thus formed can be achieved, for example, by sputtering the layer using a shadow mask during production. FIG. 3 shows a possible implementation of a shadow mask 30. Furthermore, the layer thickness gradient 5 can be produced by slowly driving a so-called shutter to the side when applying the layer. Such a production process can also be performed fully automated. Furthermore, such a layer thickness gradient can be generated by a rotating, eccentrically shaped shadow mask.

Figure 4:
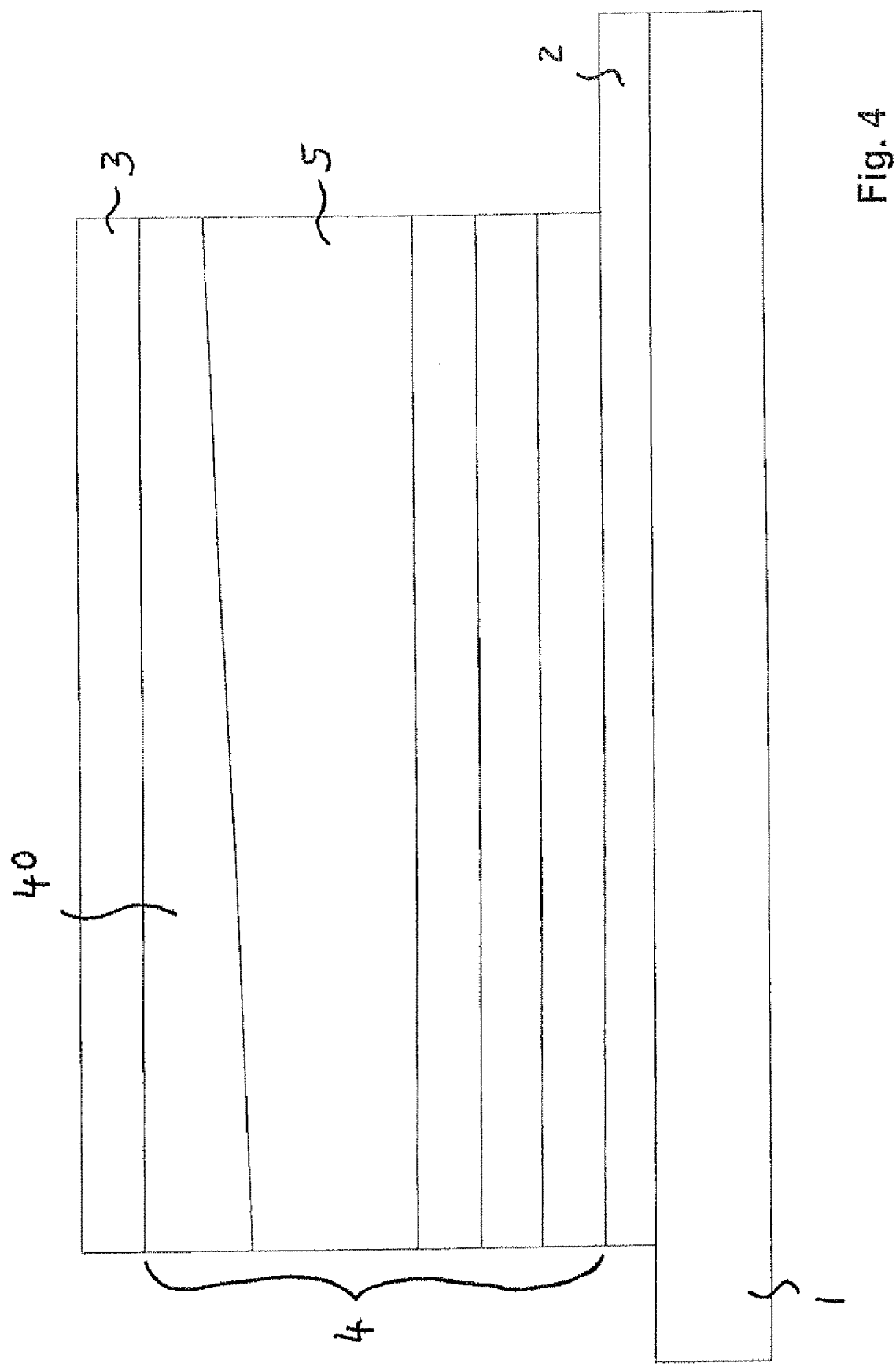

FIG. 4 shows a schematic illustration of a layer array of a light-emitting organic component in which a compensation for a layer thickness gradient is provided. By means of the further organic layer 40 with a layer thickness gradient in the opposite direction, it is prevented that the optical properties within the region between the base electrode 2 and the cover electrode 3, also referred to as optical cavity, change. A component having a constant thickness between the base electrode 2 and the cover electrode 3 thus results. Due to the layer thickness gradient 5, the further layer 40 has a lower electrical layer resistance in comparison with the layer. Preferably, the further organic layer 40 consists of a redox-doped material with a virtually negligible electrical resistance.

Layer thickness gradients generated in the described manner in the organic layer array 4 are not necessarily linear in one direction. Any layer thickness gradients may be realized, for example by using hole masks not too close to the substrate 1. In this way, complex differences in light intensity within the surface area of the component originating from a complex course of the electrical feed resistance may be compensated.

Figure 5:
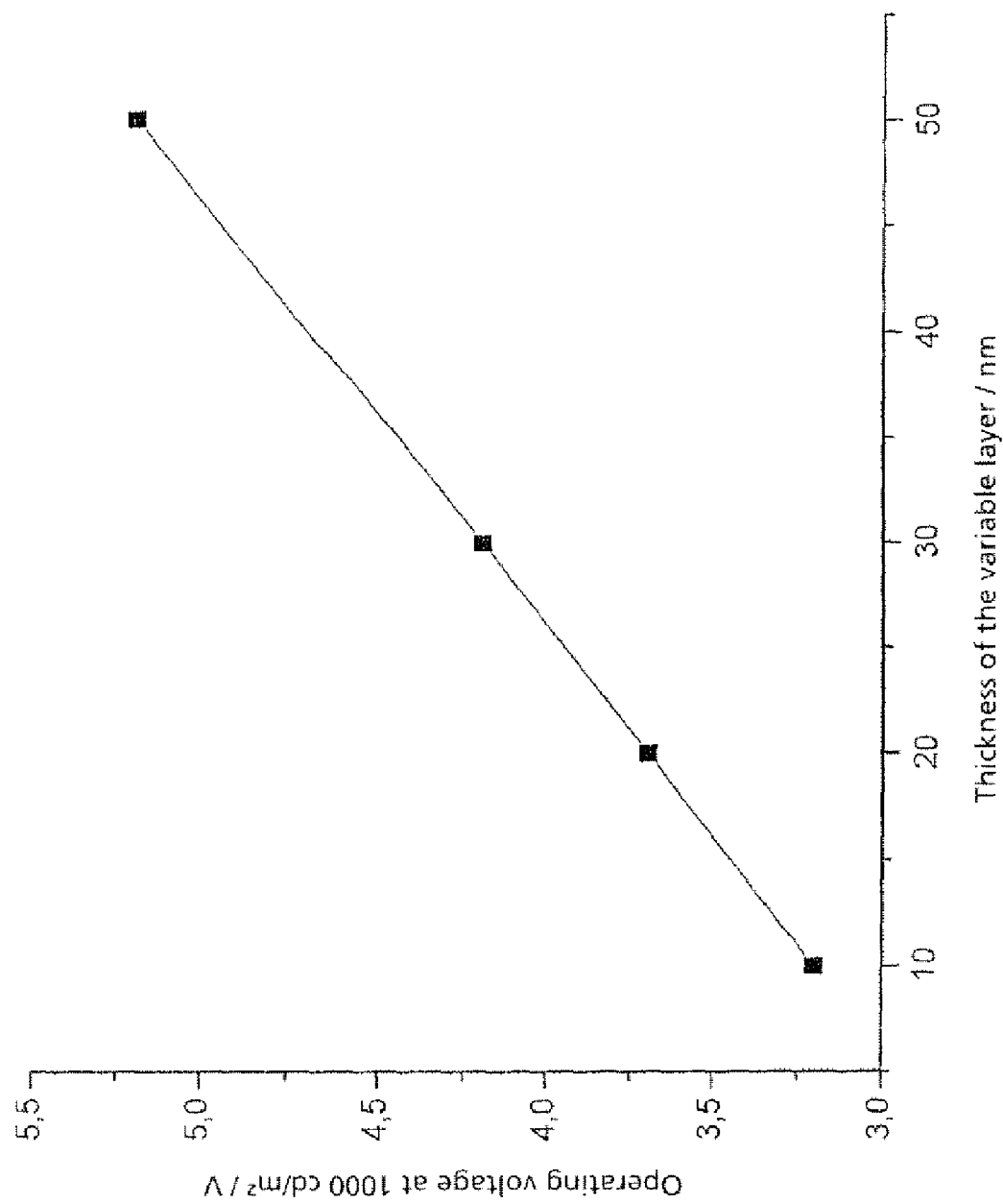

FIG. 5 shows a graphic illustration for the operating voltage as a function of the thickness of an organic layer. Here, a voltage drop of 0.5 V corresponds to a difference in thickness of about 10 nm. This value depends on the electrical conductivity of the layer material used. This determines which resistance gradient can be formed with which change in thickness.

Figure 6:
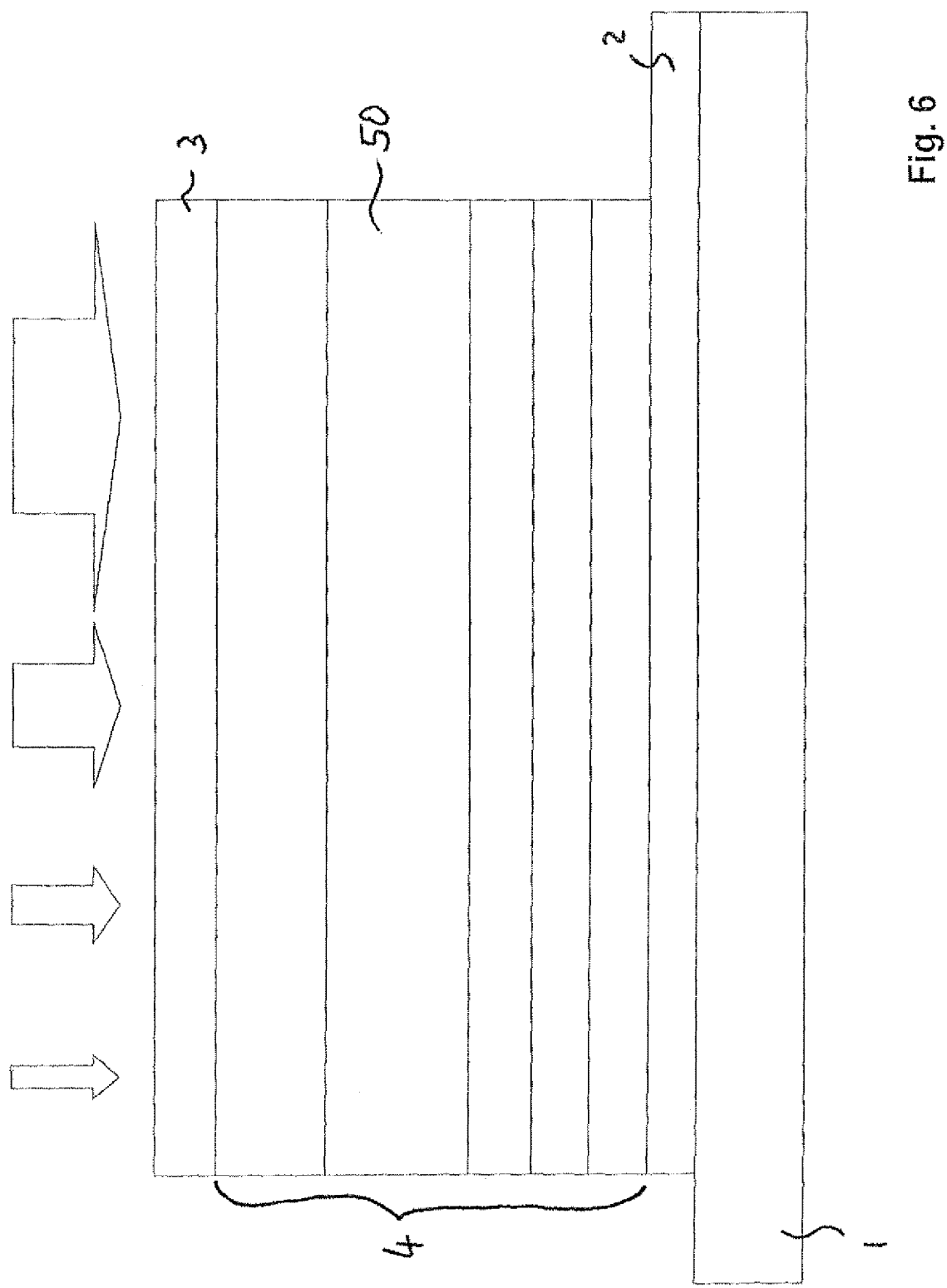

FIG. 6 shows a schematic illustration of a layer array of an organic light-emitting component to explain a method for the formation of an electrical doping gradient. In this implementation, after completing the component in which preferably all the layers in the organic layer array 4 are formed with a consistent thickness, the produced component is irradiated with UV light wherein a suitable neutral grey filter is used. In this way, the electrical doping generated during production is again photodeactivated according to a desired gradient profile in the organic layer array 4, namely in the electrically doped layers provided therein, for example a layer 50, which are electrically doped charge-carrier transport layers, for example, such that an electrical doping gradient is formed in the organic layer array 4. The doping gradient profile can alternatively be produced by means of photoactivation. The electrical doping gradient thus formed leads to the electrical resistance gradient which, thanks to the compensation of the electrical feed resistance, leads to a homogeneous lighting appearance with a light intensity which is uniformly formed in the surface area. In the photodeactivation of the dopants by irradiation, higher exposure intensities are used within the region adjacent to the connection of the transparent electrode. On the other hand, if the stepped photoactivation of the dopants by irradiation is used for the gradient formation, the lowest exposure intensities are used in regions adjacent to the connection of the transparent electrode.

A particular advantage of the described embodiments is the complete maintenance of the current efficiency of the light-emitting organic components. In fact, additional ohmic losses only form due to the slightly raised electrical resistance of the component. Even these keep within a limit. A voltage drop of on average only about 0.25 V at an operating voltage of 2.5 V only corresponds to a loss of 10%. The gain is to obtain a homogeneously illuminated surface area. In other words, the current efficiency is maintained, the performance efficiency uniformly drops over the entire surface area of the light-emitting component to the value of the regions the illumination of which was originally the weakest which are typically the furthest from the connections of the electrode.

In the following, exemplary embodiments for the formation of a doping gradient are explained with reference to the enclosed FIG. 7 which depicts characteristics of an organic light-emitting diode produced in accordance with example 2.

An exemplary embodiment 1 relates to photostructuring by stepped or gradual activation.

To produce a light-emitting organic component, here an OLED, the organic layers and the metal layer (electrode) were deposited by means of thermal evaporation onto ITO-coated glass forming a substrate in an ultra-high vacuum system at a pressure of about $10^{-7}$ mbar without interrupting the vacuum during the production. The deposition rates and thicknesses were controlled by means of crystal monitors. The production of the OLED was performed protected from light. To this end, ytterbium steam (see below) was diverted by means of graphite pipe towards the substrate during the metal deposition to avoid exposure to light from the heated metal crucible.

The OLED has the following structure:
1.0) 90 nm ITO
1.1) 50 nm 2,2',7,7'-tetrakis-(N,N-dimethylphenylamino)-9,9'-spirobifluorene doped with 4% 2-(6-dicyanomethylene-1,3,4,5,7,8-hexafluoro-6H-naphthalen-2-ylidene)-malononitrile
1.2) 10 nm NPB
1.3) 20 nm NPB doped with 15% bis-(1-phenylisoquinoline)(acetylacetonate) iridium(III)
1.4) 10 nm 2,4,7,9-tetraphenylphenanthroline
1.5) 60 nm 2,4,7,9-tetraphenylphenanthroline doped with 10% 10c,10c'-bis-(8,9-dimethyl-2,3,5,6-tetrahydro-1H,4H-3a,6a,10b-triazafluoroanthenyl)
1.6) 100 nm ytterbium This is a red OLED having an emission maximum at 620 nm.

A voltage of 4 V is applied to the sample directly after processing. At this voltage, only a very weak light emission of below 10 cd/m$^2$ occurred. After processing and during measuring, the OLED was exclusively subjected to yellow-orange ambient light. Half of the OLED was subsequently covered in a light-tight manner. The other half was irradiated with blue light (peak wavelength of about 450 nm) for a time period of one minute. The light-tight cover was subsequently removed. The OLED was measured again. The exposed part was now illuminated with a light intensity of 1000 cd/m$^2$ at a voltage of 3.9 V. The current efficiency is 4 cd/A at this light intensity. The unexposed part, however, continues to glow very weakly. In other words, the light intensity achieved at 4 V can be set by simple irradiation at between 10 and 1000 cd/m$^2$, the actual setting taking place by means of the irradiation dose. By means of a calibration curve of light intensity vs. irradiation dose, any light intensity profile can now be generated over the surface area of the OLED or any occurring inhomogeneity in the light intensity can be compensated over the surface area of the OLED, respectively.

An exemplary embodiment 2 relates to photostructuring by deactivation.

The OLED employed here has the following structure:
2.0) 50 nm 2,2',7,7'-tetrakis-(N,N-ethylphenylamino)-9,9'-spirobifluorene doped with 4% F4-TCNQ
2.1) 10 nm NPB (NPB=N,N'-bis(naphthalen-1-yl)-N,N'-bis(phenyl)benzidine)
2.3) 20 nm NPB doped with 10% bis-(2-methyldibenzo[f,h]quinoxaline)(acetylacetonate) iridium(III)
2.4) 10 nm BPhen
2.5) 60 nm of BPhen doped with Cs
2.6) 100 nm aluminium This is a red OLED having an emission maximum at 610 nm. The OLED achieved a light intensity of 270 cd/m$^2$, corresponding to the typical brightness of a monitor, at a voltage of 2.5 V. The current efficiency is 26 cd/A at this light intensity.

If this OLED is exposed with UV light of a mercury vapour lamp (1000 W, distance of 50 cm between lamp and sample) for a time period of 30 minutes, the current efficiency is maintained; however, the current-voltage characteristic is flattened markedly. Thus, only a luminance of 5 cd/m$^2$ is now achieved at an applied voltage of 2.5 V. Thus, the light emission was reduced by a factor of more than 50 at the same voltage.

Figure 7:
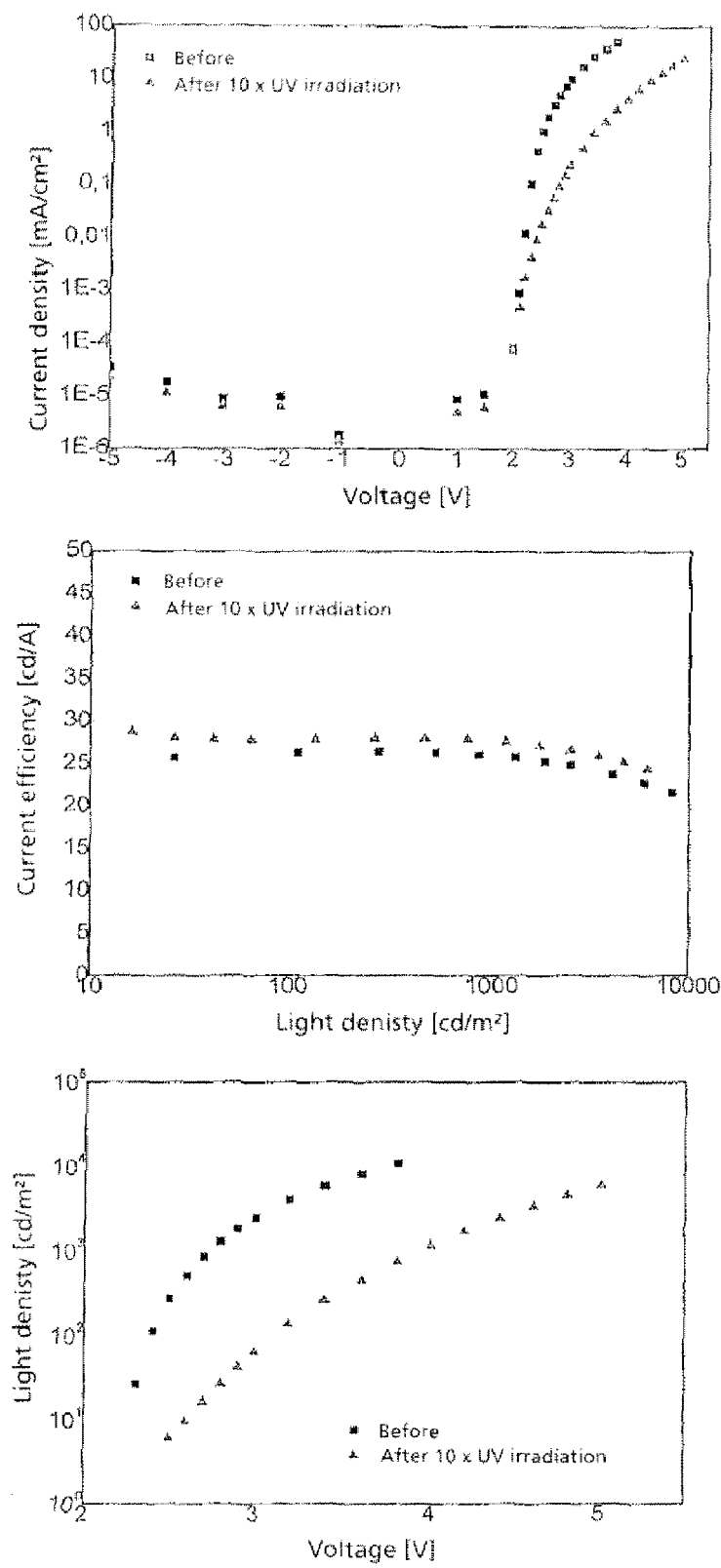

FIG. 7 depicts the characteristics of an organic light-emitting diode produced according to example 2. In this connection, the first and third sub-schemes are the most meaningful. It can be clearly seen that the current or light density of a deactivated OLED is by at least 1.5 orders of magnitude lower than before at a given operating voltage (for example 3V). In other words, the initial light intensity randomly chosen can be set by simple irradiation with UV light at between 5 and 270 cd/m$^2$, the actual setting taking place by means of the irradiation dose. By means of a calibration curve of light intensity vs. irradiation dose, any light intensity profile can now be generated over the surface area of the OLED or any occurring inhomogeneity in the light intensity can be compensated over the surface area of the OLED, respectively. The impressed gradient profile of the completed components according to the invention can be protected from fading by UV filters, for example.

In principle, the methods using an activation or a deactivation are identical in essence; the products solely have an inverted lighting behaviour. Using the deactivation could have the advantage that no preventive measures with regard to the protection from light etc. have to be considered during the processing of the OLED.

The method including activation or deactivation may be used for the production of large-area components with a homogeneous light intensity for general lighting purposes, for example.

Particular mention should be made to the possibility according to the invention to variably generate charge carriers as a function of the irradiation duration or irradiation intensity. The use of a mask having strong or minor UV filter properties or a short or long exposure by means of laser lithography generates few and many charge carriers, respectively. As a consequence of this, regions of the OLED glowing darker and brighter result. Thus, intensity courses in the radiation of an OLED can also be realised. Individual, free-hand writing onto an OLED to be activated with a suitable portable light source is also conceivable.

In principle, the activation mechanism can also be used for polymer OLEDs by mixing suitable dopants into the polymer solution and then sputtering them together. The doping then takes place as described above.

The features of the invention disclosed in the above description, the claims and the drawing can be of importance both taken on their own and in any combination to implement the invention in its different embodiments.

The invention claimed is:

1. A light-emitting organic component comprising an electrode spread over an electrode surface area, a counter electrode spread over a counter electrode surface area, an organic layer array arranged between the electrode and the counter electrode, and an electrical resistance gradient in a direction substantially parallel to the electrode surface area, wherein the electrical resistance gradient is arranged within a region of the organic layer array at least partially overlapping with the electrode surface area, and wherein the organic layer array is in electrical contact with the electrode and counter-electrode.

2. The component according to claim 1, wherein the electrical resistance gradient is adjacent to a connection at the electrode with a maximal electrical resistance.

3. The component according to claim 1, wherein the electrical resistance gradient comprises several electrical partial resistance gradients.

4. The component according to claim 1, wherein the electrical resistance gradient comprises one or more sections, wherein the sections comprise an electrical doping gradient in the organic layer array.

5. The component according to claim 1, wherein the electrical resistance gradient comprises one or more sections, wherein the sections comprise a first layer thickness gradient in the organic layer array.

6. The component according to claim 5, wherein the first layer thickness gradient comprises a wedge-shaped layer in the organic layer array.

7. The component according to claim 5, wherein the organic layer array comprises a second layer thickness gradient which compensates the first layer thickness gradient, wherein the second layer thickness gradient has a lower electrical layer resistance than the first layer thickness gradient.

8. The component according to claim 5, wherein the first layer thickness gradient extends over several layers in the organic layer array.

9. The component according to claim 5, wherein the first layer thickness gradient comprises at least one layer selected from the group consisting of: blocking layer, intermediary layer, emission layer, and charge-carrier transport layer.

10. The component according to claim 5, wherein the first layer thickness gradient comprises a current-limiting layer in the organic layer array.

11. The component according to claim 1, wherein the electrode is a transparent electrode.

12. A method for the production of a light-emitting organic component comprising spreading an electrode over an electrode surface area; spreading a counter electrode over a counter electrode surface area; forming an organic layer array between the electrode and the counter electrode so that the organic array is in electrical contact with the electrode and counter electrode; and forming an electrical resistance gradient, in a direction substantially parallel to the electrode surface area, within a region of the organic layer array at least partially overlapping with the electrode surface area.

13. The method according to claim 12, wherein the resistance gradient is formed adjacent to a connection at the electrode with a maximal electrical resistance.

14. The method according to claim 12, wherein the resistance gradient is formed with several electrical partial resistance gradients.

15. The method according to claim 12, wherein the electrical resistance gradient is formed in one or more sections, wherein the sections comprise an electrical doping gradient in the organic layer array.

16. The method according to claim 15, wherein the electrical doping gradient is formed in sections by light irradiation.

17. The method according to claim 12, wherein the electrical resistance gradient is formed at least in sections by a first layer thickness gradient in the organic layer array.

18. The method according to claim 17, wherein the first layer thickness gradient is formed by a wedge-shaped layer in the organic layer array.

19. The method according to claim 17, wherein a second layer thickness gradient is formed in the organic layer array to compensate the first layer thickness gradient, and wherein the second layer thickness gradient has a lower electrical layer resistance than the first layer thickness gradient.

20. The method according to claim 17, wherein the first layer thickness gradient extends over several layers in the organic layer array.

21. The method according to claim 17, wherein the first layer thickness gradient comprises at least one layer selected from the group consisting of: blocking layer, intermediary layer, emission layer, and charge-carrier transport layer.

22. The method according to claim 17, wherein the first layer thickness gradient comprises a current-limiting layer in the organic layer array.

* * * * *